United States Patent [19]
Locke

[11] 3,984,821
[45] Oct. 5, 1976

[54] ASSOCIATIVE MEMORY USING RECIRCULATORY SHIFT REGISTER CELLS

[75] Inventor: Alan Edward Locke, St. Albans, England

[73] Assignee: Honeywell Information Systems Limited, Brentford, England

[22] Filed: Apr. 24, 1975

[21] Appl. No.: 571,024

[30] Foreign Application Priority Data
May 9, 1974 United Kingdom............... 20436/74

[52] U.S. Cl. .................... 340/173 AM; 340/173 RC
[51] Int. Cl.[2] .................. G11C 15/00; G11C 21/00
[58] Field of Search .............. 340/173 AM, 173 RC

[56] References Cited
UNITED STATES PATENTS

| | | | |
|---|---|---|---|
| 3,742,466 | 6/1973 | Hamm et al.................. | 340/173 RC |
| 3,845,474 | 10/1974 | Lange et al.................. | 340/173 AM |

OTHER PUBLICATIONS

Tsui, Associately–Memory Sequencing Arrangement, IBM Technical Disclosure Bulletin, vol. 15, No. 7, 12/72, pp. 2342–2343.

Gardner et al., Subselection in Associative Store, IBM Technical Disclosure Bulletin, vol. 12, No. 11, 4/70, pp. 2038–2039.
8/17/70, et al., Associative Memory Chips: fast, Versatile –0 and here., Electronics, 8/17/70, pp. 96–100.

*Primary Examiner*—Stuart N. Hecker
*Attorney, Agent, or Firm*—Ronald T. Reiling; Nicholas Prasinos; William F. White

[57] ABSTRACT

In an associative memory, each cell 20 (FIG. 2) includes a recirculatory shift register 30 in which information is stored, a comparator 31 for comparing the stored information with a key fed on line 22, a gate 32 for passing the results of the comparison only in a key field defined by key field signals on line 23, and a flip-flop 33 which is set to 1 if the comparison fails. Flip-flop 33 controls reading from the cell. A flip-flop 37 is used to record whether the cell is full or empty, and a compare chain 40a, 40b passing through all cells in sequence is energized onwards from the first cell in which comparison is successful.

A further development permits sequential retrieval and searching for the next key above a desired key if the desired key itself is not in the memory.

10 Claims, 5 Drawing Figures

ASSOCIATIVE MEMORY USING RECIRCULATORY SHIFT REGISTER CELLS

The present invention relates to associative memories.

In associative memories, stored words are accessed in accordance with keys forming part of the stored words, unlike the more conventional memories in which words are accessed according to known and fixed addresses regardless of the contents of the addresses. Thus associative memories in effect perform a search operation when being accessed, searching through all stored words to find the one or the few with a desired key. The precise capabilities of such a memory may vary: thus it may be able to deal with multiple responses; it may be read only, read/write, or read/write/delete; it may be able to tolerate "don't care" bits in the key; and it may permit the key to be defined as any desired part of the stored words.

The present invention provides an associative memory which can be given substantially any of these capabilities.

Accordingly, the present invention provides an associative memory comprising a plurality of cells each coupled to common control circuitry by a common bus, wherein each cell includes: a recirculatory memory; a comparison circuit fed from the recirculatory memory and with a desired key from the control circuitry; a compare flip-flop fed from the comparison circuit; and gating means controlled by the compare flip-flop and controlling the control circuitry. This is, of course, only the basic structure, and although this embodies the basic principle of the invention, in practice further features, which will be described later, are also provided to give a practical system.

In most associative memories proposed hitherto, the aim has been to equal or approach the speed performance of conventional (non-associative) memories. This implies a parallel system. To achieve the necessary comparison in the associative memory, this means that each bit location has to comprise a considerable amount of logic. When this is compared with the simple core which is all that is required for a conventional memory, it is found that the cost of an associative memory is generally prohibitive for any substantial size.

In the present invention, the parallel approach has been rejected, and a serial organization is used. This means that the access time is large compared with a parallel memory, by an order of magnitude or more. However, the quantity of logic required for each location is greatly reduced. This is partly for the simple reason that in, say a 64-bit word system, the quantity of logic required is reduced a factor of 64. In addition to this, however, the logic is essentially simpler than is required in a parallel system, since in a serial system certain functions are performed simply by storage of information from one bit cycle to the next, whereas elaborate transfer arrangements are required for a parallel system.

A further feature which the serial system can easily be arranged to provide is serial searching. It is often desirable to be able to read out all words in turn to key order. This can present considerable difficulty in a parallel system, since it requires the ability to look for "near" keys rather than "exact" keys. The basis of the problem is that if, for example, the keys are 20 bits long and there are $2^{10}$ words, some means is required for accessing these with a number of operations of the order $2^{10}$ rather than the $2^{20}$ operations of trying to access each key from 0 upwards. A related feature is the capability of searching for a key "near" to the key supplied to the memory rather than just keys identical to the one supplied. The serial system can easily provide such features, as will be seen.

Two forms of associative memory in accordance with the invention will now be described, by way of example, with reference to the accompanying drawings, in which.

Figure 1:
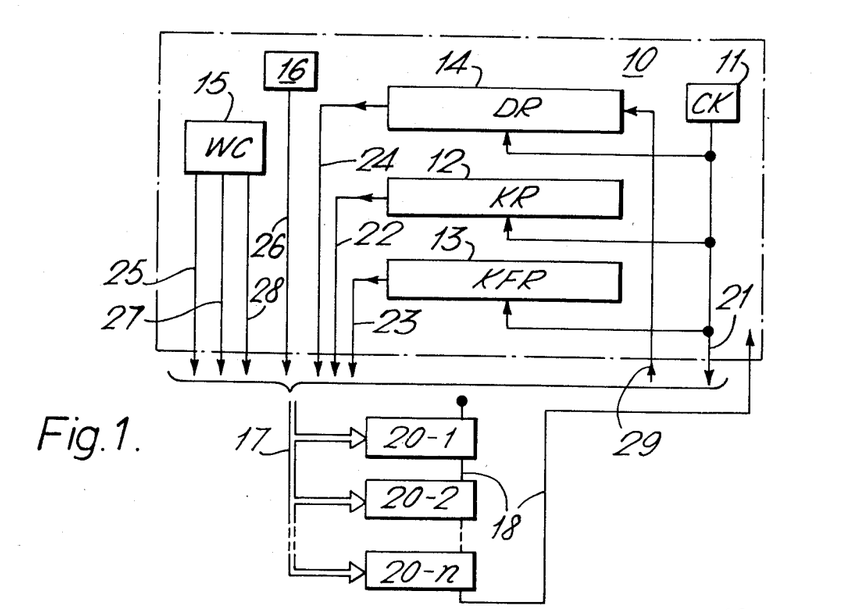
FIG. 1 is a block diagram of the first form.
Figure 2:
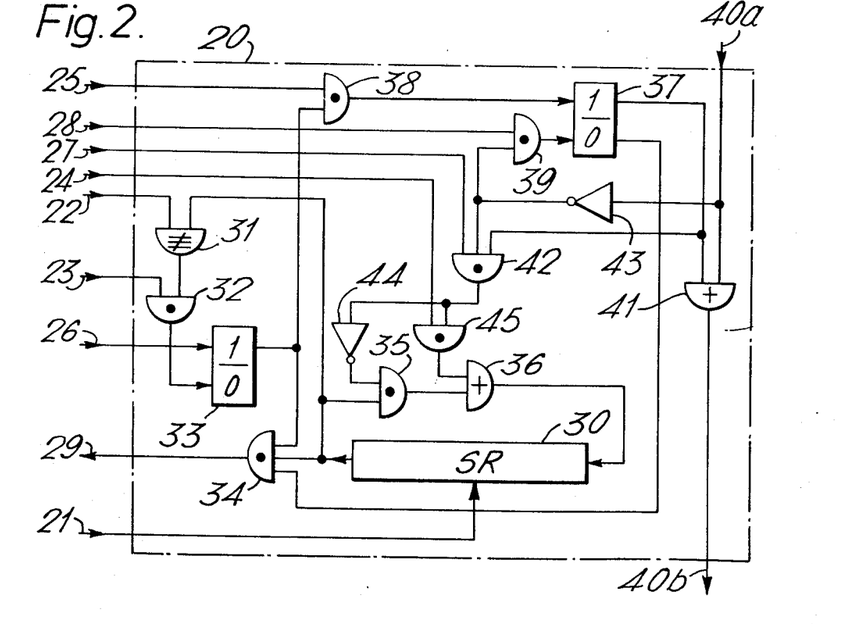
FIG. 2 is a block diagram of a cell of the FIG. 1 memory.

SIMPLE FORM: FIGS. 1 & 2

FIG. 1 is a general block diagram of a simple form of serial associative memory, comprising control circuitry 10 (some of which is shown in more detail in block 10), a series of cells 20-1, 20-2, ... 20-n, a bus 17 coupling the control circuitry to all cells in parallel, and an inhibit chain 18 coupling the cells in series. FIG. 2 shows in detail a typical cell 20. All cells are connected to the bus lines in the same way, and there is no way of distinguishing the cells or selecting any one of them except on the basis of the information stored in them.

Considering the control circuitry first, a clock source 11 (CK) generates clock pulses in sequences corresponding to the word length. There are three shift registers 12, 13, and 14 fed with clock pulses. Registers 12 and 13 together define the key, register 12 (KR) containing the desired key in the appropriate place in the word, and register 13 (KFR) containing a sequence of 1's defining the key field location in the word (so that a 0 in register 13 indicates a "don't care" bit). Register 14 (DR) is for holding a data word to be written into or read from a cell. A "search" circuit 16 generates a pulse prior to a sequence of clock pulses if it is desired to make a search in the memory, i.e. to search all cells for one containing a particular key. A write control circuit 15 controls the writing of data into cells.

Considering now the cell 20 shown in FIG. 2, this contains a recirculating shift register 30 of one word length, driven by clock pulses on bus line 21 from clock source 11. The key bus line 22 (from key register 12) and register 30 feed an exclusive-OR circuit 31, which feeds an AND gate 32 also fed by the key field bus line 23 from the key field register 13. The gate 32 feeds the 0 side of a flip-flop 33, whose 1 side is fed by bus line 26 from the control circuit 16. The 1 side of flip-flop 33 feeds an AND gate 34, also fed from the register 30, which feeds bus line 29 to the data register 14.

To search for a word with a required key, a pulse on bus line 26 sets the flip-flop 33 to the 1 state. Clock pulses are then fed to the shift registers 12 and 13 and, via bus line 21, to register 30. This causes the word stored in register 30 to recirculate through AND gate 35 and OR gate 36, and feeds the key in register 12 down the bus line 22. The exclusive-OR circuit 31 compares the key of the stored word with the desired key bit by bit, and produces a 1 if there is any difference between the two keys. Such a 1 will be fed via AND gate 32 to the flip-flop 33, setting it to 0. The key field is fed to the AND gate 32, disabling it for everything except the key portion of the word, so that flip-flop 33 can respond to a failure of comparison only on the key portion of the word.

At the end of the key, flip-flop 33 will be in the 1 state if and only if the key in cell 30 was found to be identical to the key in register 12. To read the remainder of the word, clock pulses continue to be fed to the clock bus line 21, and 0's are fed to bus line 22 to prevent flip-flop 33 from being set back to 0. Flip-flop 33 enables AND gate 34, permitting the remainder of the word in register 30 to be fed to data bus line 29 and thence to the data register 14.

During the searching and reading so far described, it is assumed that the flip-flop 37 is in its 0 state, so that AND gate 34 is not disabled. This flip-flop determines whether the cell is full or empty — i.e. whether or not it is regarded as containing any stored information. If the cell has been selected by a search operation, and its contents read out, it can effectively be emptied if desired by the write control unit 15 emitting a pulse on a clear bus line 25. This pulse is fed through the AND gate 38 to flip-flop 37 to set it to its 1 state, this indicating that the cell is empty. (Of course the information in the shift register 30 is not destroyed by this, but is no longer accessible, and will be overwritten by fresh information if the cell is written into later.)

To write a fresh word into the memory, it is necessary to select an empty cell — in fact, one cell of the many empty cells that are likely to be available. This is achieved with the aid of the inhibit chain 18, which links the cells in sequence. Each cell has an inhibit in line 40a and an inhibit out line 40b, coupled together by an OR gate 41 which is also fed with the 1 output of flip-flop 37. The first cell in the memory has a 0 fed to its inhabit in line 40a. Supposing the first few cells in the memory to be all full, i.e. containing stored information, their flip-flops 37 will all be in the 0 state, and the inhibit out lines from them will all be at 0. The first empty cell will have its flip-flop 37 at 1, which will ensure that the inhibit in line to all subsequent cells is at 1, and its inhibit in line at 0. The first empty cell is therefore selected, by means of AND gate 42, which detects when flip-flop 37 is at 1 and the inhibit in line 40a at 0 (by inverter 43).

To write information into the cell so selected, the write control circuit 15 energizes a write bus line 27, completing the enabling of AND gate 42. This enables an AND gate 45, and, via an inverter 44, disables the AND gate 35. With AND gate 35 disabled, data can no longer recirculate around the shift register 30. The fresh data to be written is applied over bus line 24 from the data register 14 (where it is assumed to have been previously stored) through AND gate 45 of the selected cell and thence through OR gate 36 into the shift register 30. The clock source 12 of course provides clock pulses as appropriate, to enable the shift register SR to store the incoming information.

When the information is stored, the write control circuit 15 energizes a write complete bus line 28 to set flip-flop 37 in the selected cell to 0, indicating that the cell is no longer empty. AND gate 39 ensures that only the flip-flop of the first empty cell is set to 0; the state of the flip-flop is not used for this, since those already at 0 can be reset to 0 without any effect.

It will be realized that there is complete freedom in defining the structure of the stored words as key and data. The simplest way of using the memory is to put the key at the beginning of the word. The key comparison process will initially result in many of the cells emitting their contents onto the bus 29, for as long as their keys are identical to the desired key in register 12, and being isolated from bus 29 when key differences are found. Eventually, just one cell is left with key identity, and the data portion of that word is then gated onto bus 29 without interference; in this memory, multiple responses are not allowed and will cause malfunction if they occur. If the key is chosen in some other part of the word, then successful reading of the data cannot occur until after the key comparison has been completed. The whole of the word can be read out by employing a second word length sequence of clock pulses, leaving the bus 26 unenergized so that the flip-flop 33, and the corresponding flip-flops in other cells, are not reset to 1. It is irrelevant whether the key search is repeated or not on the second word cycle; at the end of it, the data register 14 will contain the desired word.

It will also be realized that the memory can easily be modified by making the registers 30 of the cells several words long, and reading the registers 12 and 13 several times in the course of a full circulation of the data in the shift registers of the memory cells. A search process would then be continued until the desired word was found or until a complete recirculation of words in each register of the cells had been achieved. For writing, however, further modifications are needed. One possibility is to provide as many full/empty flip-flops in each cell as there are words in a cell. These flip-flops would be arranged in the form of a cyclic shift register, so that each in turn was connected as the flip-flop 37 of FIG. 1 as the corresponding word was appearing at the end of shift register 30. Another possibility is to use the flip-flop 33 to control the writing of data into a cell, so that a cell which has been located by a successful search can have fresh data written into it immediately if desired. If the cell is merely to be emptied, a word with the next key from a special sequence, unlike any normal key range, would be written into it. When a fresh word is to be written into the memory, the current key of the special sequence is searched for, and the cell so located has the new word written into it. The special sequence of keys can conveniently be generated by a counter which is incremented for clearing a cell and decremented on writing a new word into the memory.

Figure 3:
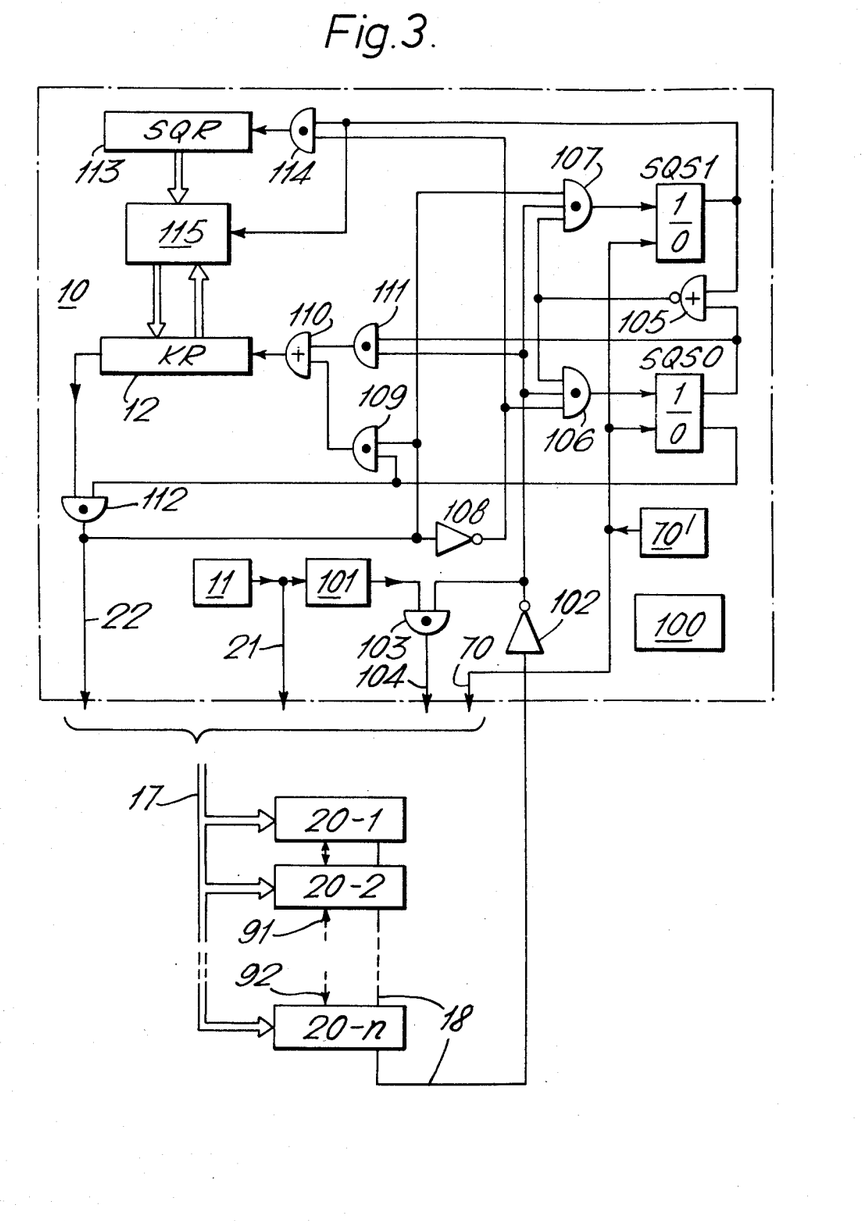
FIG. 3 is a block diagram of the second form.
Figure 4A:
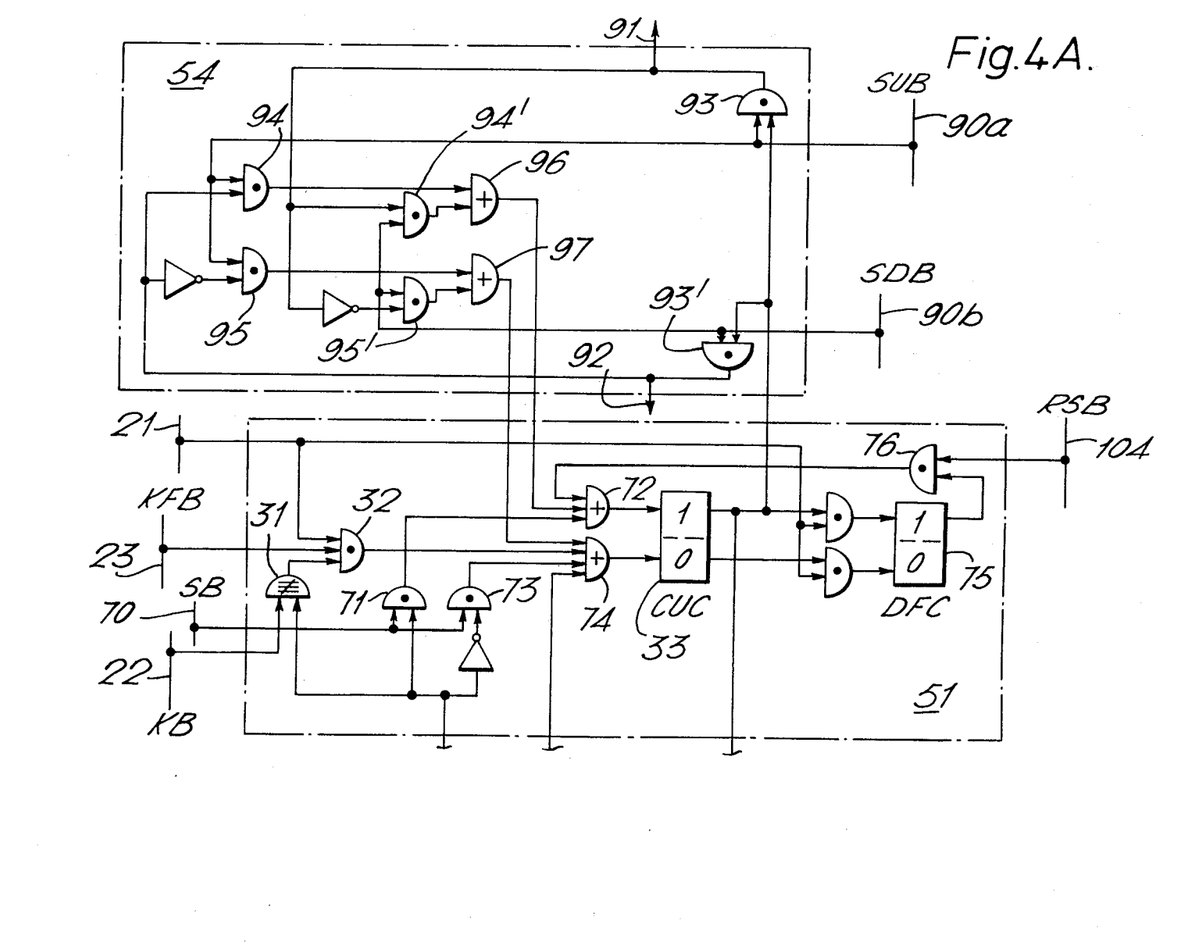
FIGS. 4A and 4B together are a block diagram of a cell of the FIG. 3 memory.
Figure 4B:
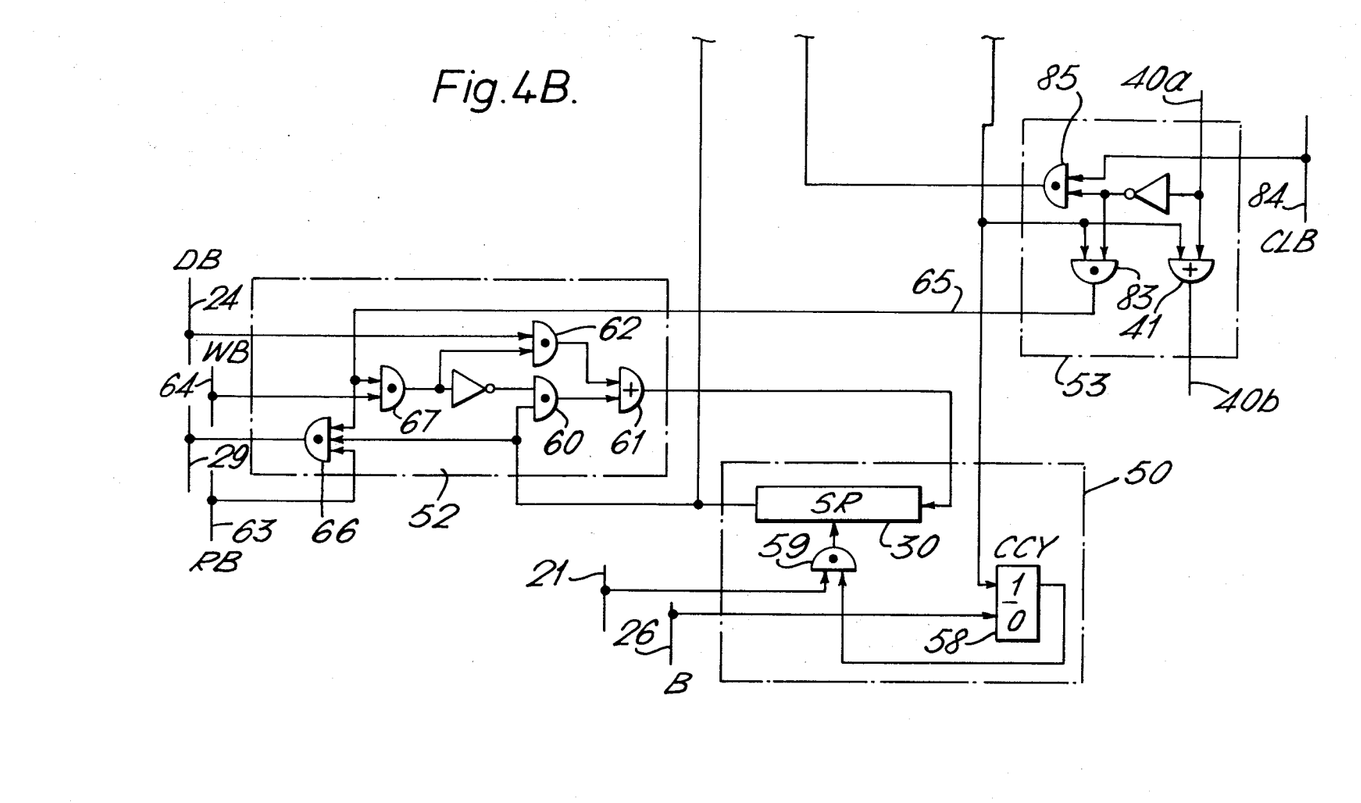

MORE ELABORATE SYSTEM: FIGS. 3, 4A, AND 4B

The memory described with reference to FIGS. 1 and 2 has several undesirable features; and the most notable is that it cannot deal with multiple responses. Accordingly, a more elaborate memory which avoids these disadvantages and has other desirable features will now be described.

Before considering the circuitry in detail, the format of the invention to be stored therein will be described. In the system described above, the format was essentially one record per cell, although it was easy to modify this to several records per cell. In contrast, the memory to be desired uses a record length which is normally much greater than the cell length, so that each record occupies a considerable number of cells. Each record consists of a number of words, each of the cell length, which are stored in electrically adjacent cells. The records may contain one or more fields which can be searched; to distinguish the searchable fields, or more precisely to distinguish the first word of each searchable field, the first bit of a searchable field is a 1, while the first bit of all other words is 0. Thus a search operation can only give a positive result for cells with 1 as their first bit. If each record contains more than one searchable field, each such field must be distinguished by a different sequence of bits somewhere in it (after the initial 1).

The records may be of fixed format, i.e. of predetermined length and with the searchable fields at predetermined positions in them. Considerable variation of format is however possible, as long as the records provide some means for full retrieval once they have been located. A record is located by a successful search for a searchable field in it; it must then be possible to determine how far the record extends on each side of this searchable field. This could be done, for example, by providing special start and stop words, or by providing distance-to-start and distance-to-stop numbers adjacent to the searchable fields.

FIG. 3 is a block diagram of the memory, consisting like the memory of FIGS. 1 and 2 of control circuitry 10 and cells 20-1, 20-2, . . ., 20-n. In the control circuitry 10, only those parts which are discussed at length are shown in detail; other parts, including many parts which are identical to the corresponding parts in the control circuitry of the FIG. 1 memory, are not shown explicitly.

Referring now to FIGS. 4A and 4B, a single cell is shown. This consists of five main sections; a store and cycle control section 50, a compare section 51, a read/-write section 52, a compare chain section 53, and a shift section 54.

Considering first the store and cycle control section 50, this consists of a shift register 30, a cycle control flip-flop 58 (CCY) and an AND gate 59 as shown. The flip-flop CCY is used for technical rather than logical reasons. One convenient form of shift register uses very little power while quiescent, but a relatively high power when information is being shifted through it. Flip-flop CCY is used to reduce the number of "unnecessary" shifts of the shift register. When a search operation is begun, flip-flop CCY will be set to 1 only if the first bit of the shift register is a 1 (indicating that it contains a searchable field, or the start of such a field). At the beginning of a search operation, a pulse on the initialize bus 26 (IB) sets flip-flop CCY to 0; it will be almost immediately set to 1 if the shift register has a 1 at its output end, as will be explained below. It is also reset to 0 after each full word period, being set back to 1 again almost immediately under control of the compare section of the circuitry if appropriate. Flip-flop CCY controls the clock pulses from bus 21 by means of gate 59, the output of this gate controlling the shifting of the shift register SR.

The read-write section 52 controls the recirculation of data through the shift register SR, the reading of information from it, and the writing of fresh information into it. Normally, gates 60 and 61 provide a recirculation path. Reading and writing are controlled by a read bus 63 (RB) and a write bus 64 (WB) respectively, and also by a "cell select" signal on line 65. For reading, true signals on the read bus RB and the line 65 together enable AND gate 66, permitting data to pass from the shift register SR to the data bus 29. For writing, AND gate 67 detects the presence of true signals on line 65 and write bus WB together; this enables AND gate 62, permitting data to pass from the data bus 24 to the shift register SR, and at the same time disables AND gate 60, preventing recirculation of data already in the shift register.

The next section to be considered is the compare section 51. This includes a current cycle compare flip-flop 33 (CUC). To start a search, a search bus 70 (SB) is energized, enabling AND gates 71 and 73. This sets flip-flop CUC to 0 or 1 by a signal through one or other of OR gates 72 and 74, depending on the first bit in the shift register SR. (The shift register is of a type in which the first bit is always available.) This first bit defines whether or not the shift register contains the start of a searchable field. At the same time as the search bus SB is energized, the initialize bus 26 (IB) is energized, setting flip-flop CCY to 0. If the cell contains the start of a searchable field, flip-flop CUC is set to 1, immediately switching flip-flop CCY to 1. Thus the shift register SR will recirculate only for the start of a searchable field.

After these initial functions, the key bus 22 (KB) and the key field bus 23 (KFB) have the key and key field respectively fed down them, simultaneously with clock pulses on the clock bus 21 (CKB). Exclusive-OR gate 31 compares the key with the stored word in the shift register SR, bit by bit, and gate 32 enables a non-equivalence between these the key and the stored data to set flip-flop CUC to 0, via OR gate 74, only if the difference occurs in the key field. Thus at the end of the word cycle, flip-flop CUC will remain at 1 only if the key search has been successful.

Leaving section 51 for the moment, the compare chain section 53 will next be considered. We may assume for the moment that the memory is being used as a one word per record memory, like that of FIG. 1, so that every cell contains a separate record (and each record will therefore start with a 1, indicating a searchable field). At the end of a key search, the CUC flip-flops in most cells will have been set to 0, but some may remain at 1 (where the search has been successful), and it is desirable to be able to read them one by one. The compare chain sections of the cells in the memory are arranged in a chain, each feeding the next. Circuit section 53 has a "compare chain in" line 40a, from the preceding cell, and a "compare chain out" line 40b, feeding the following cell. If flip-flop CUC in any preceding cell has been set to 1, input line 40a is true. Output line 40b is fed from OR gate 41, which is fed by line 40a and flip-flop CUC, so that this output line will be true of any preceding cell has its flip-flop CUC set to 1 or if the present cell has its flip-flop CUC set to 1.

The first cell in the chain with its flip-flop CUC set to 1 is therefore distinguished by having its flip-flop CUC at 1 and its input line 40a false. This condition is detected by an AND gate 83, which drives the line 65. As explained above, this line controls reading and writing. Thus if there is a multiple response — i.e. if several cells have the same key — the first of them is selected for reading or writing, and the others do not interfere with this.

It may be that the key field is at the beginning of the word. If so, reading or writing of the remainder of the word can be accomplished in the remaining part of the word cycle. If however the key field is not at the beginning of the word, then a second word cycle may be needed for reading or writing. Such second cycle will follow the first without any energization of the initialize bus 26, so that the setting of flip-flop CCY in each cell with remain unchanged.

Having read or written such a cell, it is also desirable to be able to move on to the next cell (if any) with its flip-flop CUC set to 1 — that is, to be able to take the next word with the same key if the search has revealed that there is more than one word with the desired key. A "clear for next cell" bus 84 (CLB) feeds an AND gate 85, also fed with the complement of the signal on line 80. Thus energizing bus CLB causes AND gate 85 to produce a true output if no previous cell has its CUC flip-flop set to 1. AND gate 85 feeds flip-flop CUC via OR gate 74, and a true output from this AND gate sets the flip-flop CUC to 0. Energization of bus CLB therefore sets the first CUC flip-flop at 1 back to 0, leaving all other CUC flip-flops unchanged. A second read or write operation will therefore read or write the next cell which had its flip-flop CUC set to 1. By repeating the process, any number of cells with the same key can be read and/or written in turn.

It is worth noting that the first cell in the memory will, of course have no input line 40*a* (or, what is equivalent, will have a 0 permanently on such input line). The output line 40*b* from the last cell in the memory will provide an indication of whether or not a search has been successful. Further, if the search has been successful and cells are being read or written in turn, the output line 40*b* from the last cell will remain true as long as there is still at least one cell with a successful comparison which has not yet been read or written.

The memory of FIG. 3 is, however, designed to permit record of several words length to be used. It is therefore necessary to be able to move from one cell to the next, either to continue a search where the key extends over more than one word, or to read or write all words of a record. This facility is provided by the shift section 54. This is fed by two buses 90*a* and 90*b*, for shifting up (SUB) and shifting down (SDB) respectively. It also has two input/output lines chained to the adjacent cells; line 91 to the next cell above, and line 92 to the next cell below. To move to the next cell up in the memory, bus SUB is energized. This enables AND gate 93, passing the state of flip-flop CUC of the cell on to the next cell above by means of line 91. At the same time, the state of flip-flop CUC of the next cell below is received on line 92. Flip-flop CUC of the current cell is set to this state by means of the AND gates 94 and 95 and OR gates 96 and 97. Moving to the next cell below is accomplished similarly, by energizing bus SDB, enabling corresponding AND gates 93′, 94′ and 95′. After such a shift, it is desirable to energize the initialize bus IB, to set the flip-flops CCY of the cells just left back to 0. It is also desirable to energize this bus after a compare operation of one word length, to reduce the number of flip-flops CCY still at 1.

The process of writing, as so far described, follows on when desired from a search operation (possibly with a read operation in between). That is, when a record with a specific key has been located, a fresh record can be written over it (thereby deleting the original record). This requires, of course, that the new record be no longer than the one deleted. It may be desirable to be able to write fresh records without having to delete old ones. This can be achieved by using a special dummy record format, having a key which is distinct from the key of any real record. The dummy record format will be of variable length, and will contain, in addition to the dummy key, the record length. (The record length may be added to the end of the dummy record key.) When a record is to be deleted, a dummy record is written over it. (This preferably consists of a full overwrite, i.e. an over-write of all words, to ensure that no searchable fields of the original record are left.) When a fresh record is to be written, a search is made using the dummy record key and the length of the fresh record. A dummy record of the required length (or just over that length) is thereby found, and has the fresh real record written over it.

This may result in the real records becoming slowly shorter than the numbers of cells allotted to them. For this and other reasons (notably to get the memory into operation initially), it is desirable to provide means for setting the CUC flip-flop of the first cell in the memory to 1. This means (not shown) will comprise a line from the control circuitry 10 to the OR gate 72 of the first cell 20-1 of the memory, this line being energized to select the first cell. Records can then be written sequentially into the memory, shifting the "CUC at 1" cell steadily down through the memory. The memory may be periodically cleared, and refulled by this means; the clearing may be achieved by sequential searching, to be described next.

SEQUENTIAL SEARCHING

The memory of FIGS. 3 and 4 has the capability of sequential searching; that is, records can be accessed in sequential key order. The search may be a read and clear process if desired, with the records being removed from the memory as they are found, but the records can be left in the memory if desired. In the latter case, what happens in effect is that, after a record has been accessed, a search is made for the record with the next higher key. It follows that this memory can also be used for this process in isolation; that is, for searching for the record with the next key higher than a given key. This is equivalent to searching for a record with a key "near to" the given key.

For convenience in describing the principles of sequential searching, two limitations are assumed; first, that the sequential search is effective for all searchable fields, and second, that the key consists of a single full word. Since the searchable fields will usually be distinguished by a field code preceding the actual key, the first limitation is not of great importance; one need merely restrict the search to a limited part of the possible full key range, as defined by the field code. the second limitation can easily be overcome by suitable modifications to the circuitry to be described.

The sequential search operation is controlled by a sequential search control circuit 100 (SQC). This brings into operation the circuitry about to be described.

The process of finding the lowest key in the memory will be considered first. Initially, the key register KR is filled with 0's (apart from the initial 1 which is always present and which defines searchable fields), and the process begins like a normal search operation. The flip-flops CUC of the various cells are set to 1 initially for searchable fields and are set back to 0 as failures of comparison occur. This continues for as long as at least one flip-flop CUC is set to 1. Eventually however the last of the flip-flops CUC will be set back to 0. This is indicated by the end of the compare chain 18, from the last cell in the memory, going false.

The clock pulses on line 21 from the clock source 11 are fed to a delay circuit 101 which delays them by half a clock period. When the end of the compare chain 18 goes false, the output of inverter 102 goes true, and enables AND gate 103, so that the next delayed clock pulse from delay circuit 101 passes through onto the reinstate bus line 104. Each cell in the memory contains (FIG. 4A), in addition to the compare flip-flop CUC, a deferred compare flip-flop 75 (DFC). The outputs of the CUC flip-flop are gated to set the DFC flip-flop by the clock pulses on line 21, so that the DFC flip-flop always stores the state which the CUC flip-flop had one bit period (i.e. one clock pulse) ago. The pulse on line 104 is fed to the AND gate 76 in each cell in the memory, and those flip-flops CUC which have just been set to 0 are set back to 1 again. In other words, the effect of the comparison of the bit which has just been tested is cancelled. This sets the end of the compare chain 18 back to 1. Comparison continues until the end of the word, with resetting occurring each time the failure occurs in all cells.

The control circuitry 10 includes two flip-flops SQS0 and SQS1 which are set to 0 at the beginning of a search by the search bus line SB 70. Their 1 outputs feed a NOR gate 105 which feeds two AND gates 106 and 107 feeding their 1 inputs. These two AND gates are also fed with the output of inverter 102, and AND gate 107 is also fed with the signal on bus line 22 from register KR and AND gate 106 with the complement of this signal from inverter 108. Accordingly, when the end of the compare chain 18 goes false for the first time in a search, the outputs of inverter 102 and NOR gate 105 are both true, and flip-flop SQS0 or SQS1 is set to 1 depending on whether the output of register KR at that time is 0 or 1. Once this has occurred, the output of NOR gate 105 goes false and ensures that no further change in these flip-flops occurs during the remainder of the search period.

In the situation being considered at present, with register KR being filled with 0's, flip-flop SWS0 will be set to its 1 state the first time that the end of the compare chain 18 goes false. Up to this point, the contents of the key register KR are recirculated through AND gate 109, enabled by the output from the 0 side of flip-flop SQS0, and OR gate 110. After this point, AND gate 109 is disabled and AND gate 111 is enabled. The signals on line 18 now replace the output of the key register KR in filling the remainder of the key register KR. Each time that the comparison of a bit on line 22 succeeds, line 18 stays true, the output of inverter 102 stays false, and a 0 is set into the end of the key register KR. Each time that the comparison of a bit on line 22 fails, i.e. it is found that there is now no key in the memory which compares successfully, line 18 goes false, and inverter 102 sets a 1 in the end of the key register KR.

It will be noted that the key register KR does not in fact feed the line 22 directly, but via an AND gate 112 which is disabled by flip-flop SQS0 going to 1. This ensures that 0's are fed onto line 22 after flip-flop SQS0 has been set to 1, even though the key register KR may contain some 1's; the circumstances in which this can occur will be discussed later.

The result of all this is as follows. For the initial part of the word period of the search, the contents of the key register KR are recirculated. As soon as a failure of comparison on a 0 bit occurs, flip-flop SQS0 is set to 1, and the compare chain line 18 determines what goes into the key register KR for the remainder of the word period. At the end of the word period, the key register KR contains the smallest key in the memory, and the cell with that key has been selected.

If the memory has only the sequential search capability as described so far, i.e. can only carry out a search and clear function, then only the parts of the control circuitry 10 discussed so far will be needed. For the full sequential search capability, however, the rest of the control circuitry shown in FIG. 3 is also needed.

Before describing this hardware, the operation of the full sequential search will first be described in software terms; that is, the purely logical or mathematical aspects will be described by themselves, and the circuit functions which carry out these aspects will then be discussed.

The process operates, as above, by starting with an initial key of all 0's (apart from the initial "searchable field" 1), and takes the bits in order of decreasing significance, i.e. highest order bit first. After a record has been found and dealt with (or several records, if they have the same key), the key is increased by 1 (to ensure that only records with keys above the last key used are found) and a search is started with that key. As long as the comparison or search is successful, nothing special need be done; special action needs to be taken when a failure occurs, and there are two rules governing this. First, if the first failure of comparison occurs on a 0 bit, the comparison is continued with 0 bits exclusively and all remaining bits are determined one by one by means of the compare chain. Second, if the first failure of comparison occurs on a 1 bit, a 1 is added to the key at that point, the remaining lower order bits are set to 0, and a fresh comparison is attempted in the next word cycle.

As a convenient illustration, 6-bit keys will be taken, and it will be assumed that the lowest four keys are, ignoring the initial "searchable field" 1's:
000101
001010
001101
010110

The comparison starts with key
000<u>0</u>00
and the first failure occurs on the underlined bit. Since this is a 0, it is changed to 1 and the next 2 bits are determined from the compare chain, giving the first key,
000101.
When the record with this key has been dealt with (and any other records with this key if there is a multiple response), a failure is regarded as occurring, and a 1 is added to the last position:

---
000101      (first key)
      1
0001<u>1</u>0.
---

This is the next "trial" key, and a failure occurs at the underlined bit. Since this bit is a 1, the remaining bits are set to 0 and a 1 is added at the position where failure occurred:

---
000110
  1
0010<u>0</u>0
---

This the next "trial" key, and a failure occurs at the underlined bit. This bit is a 0, and is therefore changed to 1, and the remaining bits determined from the compare chain 18, giving the next key:
001010.

After retrieval of the record or records with that key, a 1 is added, giving the next "trial" key:

0010̲11

Failure occurring first at the underlined bit, which is a 0, the remaining three bits are determined from the compare chain 18 to give the third key:

001101

The next "trial" key is 1 more than this, i.e.

00111̲0 failing at the underlined bit, which is a 1. Adding 1 at this point gives the next "trial" key,

0100̲00

This fails at the underlined bit, which is a 0, and the remaining bits of the next key are therefore determined from chain 18, giving the fourth key,

010110.

If the process were continued, the next "trial" key would be

01011̲1

Failure occurring on the underlined bit, a 1 is added at that point, giving

011̲000

Failure occurring on the underlined bit, a 1 is added there, giving

1̲00000

A failure occurring on a 1 in the top position indicates that the search has finished. This may be regarded as a failure in the usual way; the attempted correction is the addition of 1 to the topmost bit, and the overflow resulting from this signals the end of the search.

It will be realized that the circuitry already described fulfils the first rule fully. That is, the circuitry already described can make a search with a key not consisting of all 0's, returning the key bits to the key register until a failure on a 0 bit occurs, and then AND gate 112 is disabled so that comparison continues with 0 bits alone, the compare chain 18 controlling the rest of what is returned into the key register KR.

For the second rule, on a failure occurring on a 1 bit, flip-flop SQS1 is set via AND gate 107. The remainder of the word cycle has to be completed, but what happens in the comparison process after flip-flop SQS1 is set to 1 is irrelevant. The recirculation of the contents of the key register KR is completed via gates 112, 109, and 110. Also, the remainder of the contents of the key register KR are inverted by inverter 108 and fed into an additional register SQR113 via an AND gate 114. At the end of the word cycle, the contents of register KR will have been recirculated without change, and register SQR will contain the complement of the key in register KR from the point of failure down. The two registers KR and SQR feed an adder 115, and the 1 side of flip-flop SQS1 is fed to the adder as a "carry in" and enable signal. At the end of the word cycle, the adder 115 is operated, and fills the key register KR with the sum of the previous key, the complement of the key from the point of failure down, and a 1. This gives a fresh key which has effectively had a 1 added at the point of failure and 0's inserted thereafter, and a fresh comparison is attempted with this new key.

It it is desired to deal with key fields lying within a word, no modification is required as far as the first rule is concerned; the key field register will ensure that no failure of search occurs outside the key field. For rule 2, however, the key field register KFR (FIG. 1) has to be coupled to the adder 15, via a set of inverters, to insert 1's into the key in the key register KR at each bit position outside the key field each time the adder is operated. No failure of comparison can occur on these 1's, but their insertion ensures that gaps in the key field do not affect the sequential search, and that when the search is finished, the carry out from the top of the key field propagates immediately to the top of the key register instead of getting "lost" in an area between these two points.

If the key field extends over say two words, this is also accommodated without difficulty. The search is confined to the first word until successful, and is then carried on into the second word until that is successful also. A 1 is then added to the bottom end of the second word, and searching on the first word is recommenced. Whenever the search on the second word finally fails by overflow, a 1 is added to the bottom end of the first word and searching is restarted.

It will of course be realized that this sequential search process can instead be performed by software. This will be somewhat slower, but will permit a greater flexibility in, for example, treating the bits of the key field in an order other than the natural one, as may be desired for certain types of alphanumeric code.

PARALLEL ACCESSING

As so far described, the memory of FIGS. 3 and 4 is wholly serial. This is essential, of course, for the present type of searching, but for accessing the stored information after a search is complete, it will be realized that it is simple to provide a single parallel data bus by which data can be written into and read from the shift register in the selected cell. When this is done, line 65 (FIG. 4B) controls the transfer of the stored information onto and off from the data bus in exactly the same way, but the transfer occupies a single bit period instead of a full word period. This results in a significant increase in the size of each cell, since gating onto the data bus is required for each separate bit in the shift register. However, the speed of operation of the memory is increased substantially, possibly by several times on average. The time required to read or write a record after its cells had been located is usually negligible. If the typical record length were 8 words and the word length were 64 bits, an access would be roughly 9 times as fast 0 more accurately, 8 times as fast allowing for the ⅛ word period required for actual reading or writing after the record had been located.

CELL FAILURE

It will be realized that the addition of a relatively small amount of extra circuitry will permit cell failures to be tolerated. What is needed for this is some means to identify failed cells, i.e. cells in which the stored information is not properly circulated or the logic fails; a flip-flop in the cell which can be set on identification of failure; gating means for preventing the failed cell from emitting spurious signals and causing the cell to appear permanently full; and further gating means for directly connecting together the compare chain in and out lines and, in the case of the cells of FIGS. 4A and 4B, the shift lines 91 and 92.

Having described the invention, what is claimed as new and novel is:

1. An associative memory comprising a plurality of cells coupled in series, each cell being furthermore coupled to common control circuitry by a common bus, wherein each cell includes:
   a recirculatory memory means for storing at least one word;

a comparison circuit serially fed with the bits of both a word from the recirculatory memory means and a desired key from the control circuitry, said comparison circuit being operative to compare bit by bit the desired key with a key portion of the serially fed word from the recirculatory memory means;

a compare flip-flop fed from the comparison circuit; and gating means controlled by the compare flip-flop and controlling the transfer of data between the recirculatory memory and the control circuitry.

2. An associative memory according to claim 1 wherein each cell includes means for permitting the compare flip-flop to change state only if a key field signal is received from the control circuitry.

3. An associative memory according to claim 1 wherein each cell includes a full/empty flip-flop which is set to one state on data being stored in the cell and can be set to the other state if desired on data being read from the cell.

4. An associative memory according to claim 1 wherein each cell includes a cycle control flip-flop which is set to one state for searching and is immediately set to its second state unless the first bit in the shift register indicates that the shift register contains a searchable field, the recirculation of information through the shift register being inhibited by the second state of this flip-flop.

5. An associative memory according to claim 1 wherein the cells are coupled in series by a shift chain, and a shift signal from the control circuitry causes the states of the compare flip-flops of all cells to be shifted one cell along the series.

6. An associative memory according to claim 1 wherein the cells are coupled in series by a compare chain which is energized onwards from the first cell whose compare flip-flop indicates a successful comparison.

7. An associative memory according to claim 6 wherein the gating means in each cell is inhibited from allowing the transfer of data between the recirculatory memory and the control circuitry if the compare chain into the cell is energized.

8. An associative memory according to claim 6 wherein each cell includes a deferred compare flip-flop which is set, at each bit, to the state of the compare flip-flop for the previous bit, and the control circuitry includes means responsive to the de-energization of the compare chain from the final cell to restore the compare flip-flop of each cell to the state of the deferred compare flip-flop and change the corresponding bit in the desired key being fed to the cells.

9. An associative memory according to claim 8 wherein the control circuitry further includes means responsive to the de-energization of the compare chain from the final cell on a 1 bit in the desired key to arithmetically add 1 to the desired key at that point and replacing all lower-order bits in the desired key by 0's.

10. An associative memory according to claim 1 wherein each cell has its recirculatory memory coupled to the common bus by a parallel data path.

* * * * *